(12) United States Patent
Iida (10) Patent No.: US 8,019,306 B2
(45) Date of Patent: Sep. 13, 2011

(54) AMPLIFIER AND COMMUNICATION APPARATUS

(75) Inventor: Sachio Iida, Chiba (JP)

(73) Assignee: Sony Corporation, Tokyo (JP)

( * ) Notice: Subject to any disclaimer, the term of this patent is extended or adjusted under 35 U.S.C. 154(b) by 412 days.

(21) Appl. No.: 10/580,645

(22) PCT Filed: Nov. 15, 2004

(86) PCT No.: PCT/JP2004/016961
§ 371 (c)(1),
(2), (4) Date: May 25, 2006

(87) PCT Pub. No.: WO2005/057780
PCT Pub. Date: Jun. 23, 2005

(65) Prior Publication Data
US 2007/0139117 A1    Jun. 21, 2007

(30) Foreign Application Priority Data
Dec. 10, 2003 (JP) ................................. 2003-412310

(51) Int. Cl.
*H04B 1/18* (2006.01)
(52) U.S. Cl. ............... 455/280; 455/120; 455/127.2; 330/251; 330/302
(58) Field of Classification Search ............ 455/280
See application file for complete search history.

(56) References Cited

U.S. PATENT DOCUMENTS

| | | |
|---|---|---|
| 3,461,394 A | 8/1969 | Ulmer |
| 3,531,729 A | 9/1970 | Reichard |
| 3,711,780 A | 1/1973 | Maurer |
| 3,919,656 A | 11/1975 | Sokal et al. |
| 4,009,446 A | 2/1977 | De Koning et al. |
| 4,317,231 A | 2/1982 | Maurer et al. |
| 4,524,422 A * | 6/1985 | Kasuga .................. 708/323 |
| 4,771,466 A * | 9/1988 | Modafferi ................ 381/99 |
| 6,121,840 A | 9/2000 | Sakusabe |
| 6,229,393 B1* | 5/2001 | Daners ................... 330/251 |
| 6,281,755 B1* | 8/2001 | Feld et al. ............... 330/302 |
| 6,628,221 B2* | 9/2003 | Jin ......................... 341/152 |
| 7,412,007 B1* | 8/2008 | Richley et al. ........... 375/296 |
| 2002/0030545 A1 | 3/2002 | Hashemi et al. |
| 2002/0130720 A1 | 9/2002 | Pavio et al. |
| 2003/0073423 A1 | 4/2003 | Cho |

(Continued)

FOREIGN PATENT DOCUMENTS

DE    24 15 313    10/1975

(Continued)

Primary Examiner — Duc Nguyen
Assistant Examiner — Ajibola Akinyemi
(74) Attorney, Agent, or Firm — Oblon, Spivak, McClelland, Maier & Neustadt, L.L.P.

(57) ABSTRACT

A wide-band amplifier includes a band-pass filter made of an LC parallel resonant circuit and an LCR series resonant circuit. Both the LC parallel resonant circuit and the LCR series resonant circuit are connected in parallel to a current amplifier device. The band-pass filter has a plurality of poles as well as zeros provided therebetween in the s-plane, where some of the zeros are situated at locations other than the s-plane origing to improve a characteristic flatness in a passband. The output terminal of the amplifier device serves as an output terminal for the amplifier, so that the problem of group delay does not occur. A capacitance element between the output terminal of the amplifier and GND absorbs parasitic capacitance as part of constants to prevent degradation of the frequency characteristic.

12 Claims, 8 Drawing Sheets

U.S. PATENT DOCUMENTS

| | | | |
|---|---|---|---|
| 2005/0078743 A1* | 4/2005 | Shohara | 375/219 |
| 2007/0111684 A1* | 5/2007 | Kaczynski | 455/127.2 |
| 2007/0211831 A1* | 9/2007 | Wilhelmsson | 375/329 |

FOREIGN PATENT DOCUMENTS

| | | |
|---|---|---|
| EP | 62-133834 | 6/1987 |
| GB | 651 392 | 4/1951 |
| GB | 655833 | 8/1951 |
| GB | 675562 | 7/1952 |
| JP | 62-121853 | 6/1987 |
| JP | 62-200902 | 9/1987 |
| JP | 07-263979 | 10/1995 |
| JP | 8-51340 | 2/1996 |
| JP | 08-148949 | 6/1996 |
| JP | 10-65568 | 3/1998 |
| JP | 11-225026 | 8/1999 |
| JP | 11-234062 | 8/1999 |
| JP | 2000-36721 | 2/2000 |
| JP | 2000-223963 | 8/2000 |
| JP | 2002-9564 | 1/2002 |
| KR | 1020020078901 A | 10/2002 |
| WO | 00/24118 | 4/2000 |

* cited by examiner

AMPLIFIER AND COMMUNICATION APPARATUS

TECHNICAL FIELD

The present invention relates to an amplifier and a communication apparatus which are used for transmission and reception during wireless communication, and particularly to an amplifier and a communication apparatus which are applied to, for example, UWB (ultra-wideband) communication and perform voltage amplification of a high frequency component of a received signal.

More specifically, the present invention relates to an amplifier and a communication apparatus which collectively perform amplification in a wide frequency bandwidth used in UWB communication, and particularly to a wide-band amplifier and a communication apparatus having a flat amplification characteristic over a wide frequency bandwidth, being prevented from degrading due to parasitic capacitance, and being short in group delay time.

BACKGROUND ART

Wireless LANs are receiving attention as systems which release users from the LAN wiring required in wired methods. According to wireless LANs, since almost all wired cables can be omitted in work spaces such as offices, communication terminals such as personal computers (PCs) can be comparatively easily moved. In recent years, as wireless LAN systems have increased in speed and decreased in price, demand for wireless LAN systems have remarkably increased. In recent years, consideration is particularly given to installation of personal area networks (PANs) in order to construct a small-scale wireless network and perform information communication among a plurality of personal electronic devices.

For example, a method called ultra-wideband (UWB) communication, which performs wireless communication by using an extremely wide frequency bandwidth, is recently receiving attention as a wireless communication system which realizes short-distance ultra-high-speed transmission, and such method is expected to be put to practical use. The IEEE802.15.3 committee and the like have presently proposed a data transfer method based on a packet structure containing preambles, as an access control method for ultra-wideband communication.

In UWB communication, modulation methods such as DS-SS and OFDM are considered. According the DS-SS method, during transmission, an information signal is multiplied by a random code sequence called PN (Pseudo Noise) code to directly spread (DS: Direct Spread) the occupied bandwidth, and on a reception side, the received spread information signal is reproduced into the information signal by being inversely spread by being multiplied by the PN code. The DS-SS method makes it possible to realize high-speed data transfer by performing transmission and reception in a spread ultra-high frequency bandwidth of, for example, 3 GHz to 10 GHz.

According to the OFDM (Orthogonal Frequency Division Multiplexing) method, the frequency of each carrier is set so that each carrier is orthogonal with every other carrier in a symbol duration, and during transfer of information, plural pieces of data are allocated to the respective carriers and modulation is performed on the amplitude and phase of each of the carriers, and inverse FFT is performed on the plural carriers to convert each of the carriers into a signal on the time axis with orthogonality on the frequency axis being maintained, and the signal on the time axis is transmitted. During reception, FFT is performed to convert the signal on the time axis into a signal on the frequency axis and the respective carriers are subjected to demodulation corresponding to their modulation methods to reproduce the information transmitted by the original serial signal. Since transmit data are transmitted in the state of being distributed to a plurality of carriers of different frequencies, the bandwidth of each of the carriers is narrowed narrow and becomes resistible to frequency selective fading.

In wireless communication equipment, during reception of wireless signals, it is general practice to perform voltage amplification on received signals. For example, in the above-mentioned ultra-wideband communication, voltage amplification is performed on a high frequency component by a low noise amplifier (LNA). In this case, it is desired that voltage amplification is collectively performed in a wide frequency bandwidth extending over a 2-GHz range of 3 GHz to 5 GHz which is used in UWB.

Wide-band amplifiers can be generally constructed by a combination of an amplifier device made of MOS-FETs (Metal Oxide Semiconductor-Field Effect Transistors), bipolar transistors or the like, and a band-pass filter (refer to, for example, Non-Patent Document 1).

Figure 8:
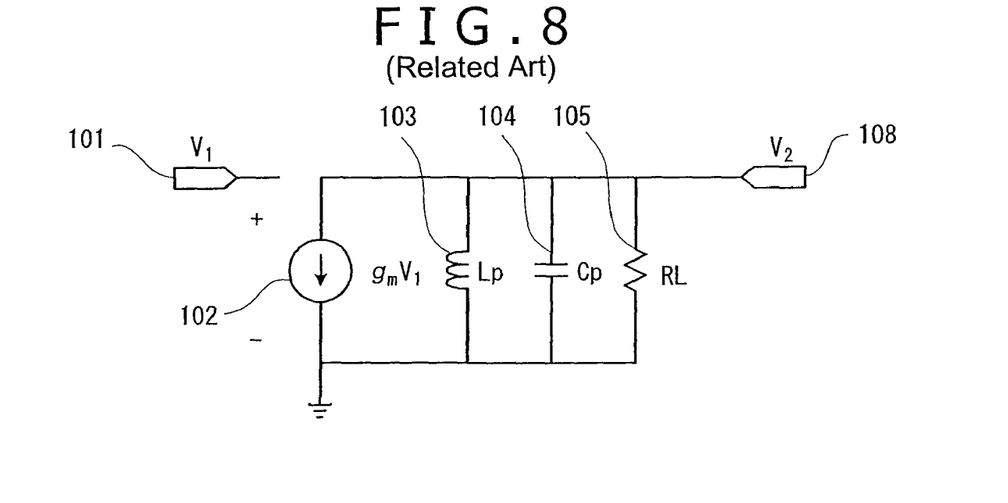
FIG. 8 is a schematic diagram of a conventional wide-band amplifier.

FIG. 8 shows the construction of a wide-band amplifier constructed by a combination of an amplifier device and a first-order band-pass filter (BPF) (refer to, for example, Non-Patent Document 2).

As shown, the wide-band amplifier is constructed so that a first-order band-pass filter made of an LC parallel resonant circuit made of a parallel coil Lp 103, a parallel capacitor Cp 104 and a resistor RL 105 is provided as a load in parallel with the drain and the source of an amplifier device 102 constructed with MOS-FETs or bipolar transistors.

In FIG. 8, reference numeral 101 denotes an input terminal of the wide-band amplifier, and reference numeral 108 denotes an output terminal of the wide-band amplifier, and the amplifier device 102 operates as a voltage-controlled current source. Specifically, a voltage V1 at the input terminal 101 is applied to the gate of the amplifier device 102, and the amplifier device outputs a current of gm times the gate voltage V1 in the direction indicated by an arrow in FIG. 8. The voltage provided at the output terminal 108 at this time is denoted by V2.

The transfer function H(s) of the wide-band amplifier shown in FIG. 8 is expressed by the following formula:

$$H(s) = \frac{-s \cdot Lp \cdot RL \cdot gm}{s^2 \cdot Lp \cdot Cp \cdot RL + s \cdot Lp + RL} \quad \text{[Formula 1]}$$

Figure 9:
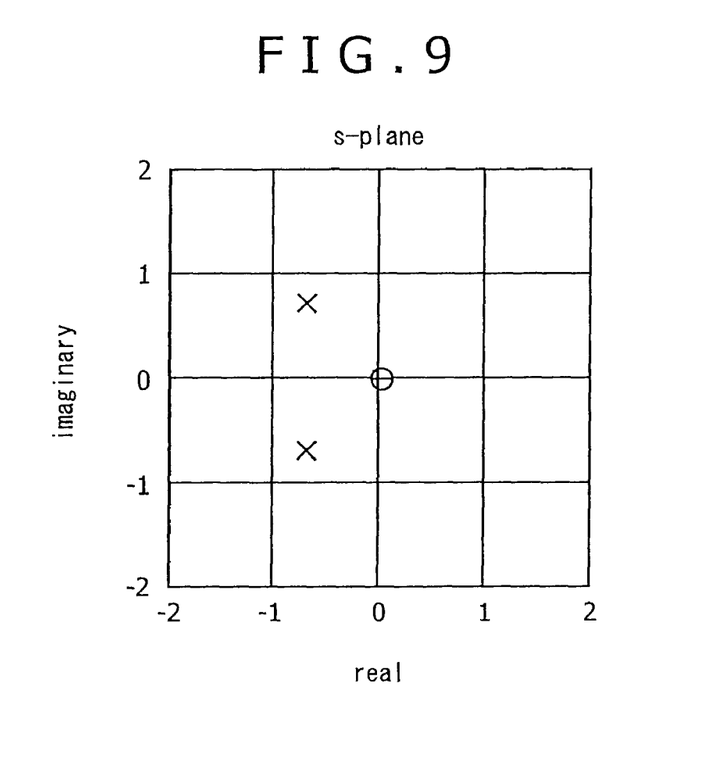
FIG. 9 is an s-plane pole-zero map of the conventional wide-band amplifier of FIG. 8.

FIG. 9 shows a pole-zero map in the s-plane of the wide-band amplifier shown in FIG. 8. In FIG. 9, the symbol "o" denotes a zero, and the symbol "x" denotes a pole. On the s-plane, poles are located at points where the denominator of the transfer function H(s) is 0, while zeroes are located at points where the numerator of the transfer function H(s) is 0. In the shown example, a zero is located at the center of the s-plane, and the number of poles that corresponds to the order of the band-pass filter appear on one side of the s-plane.

Figure 10:
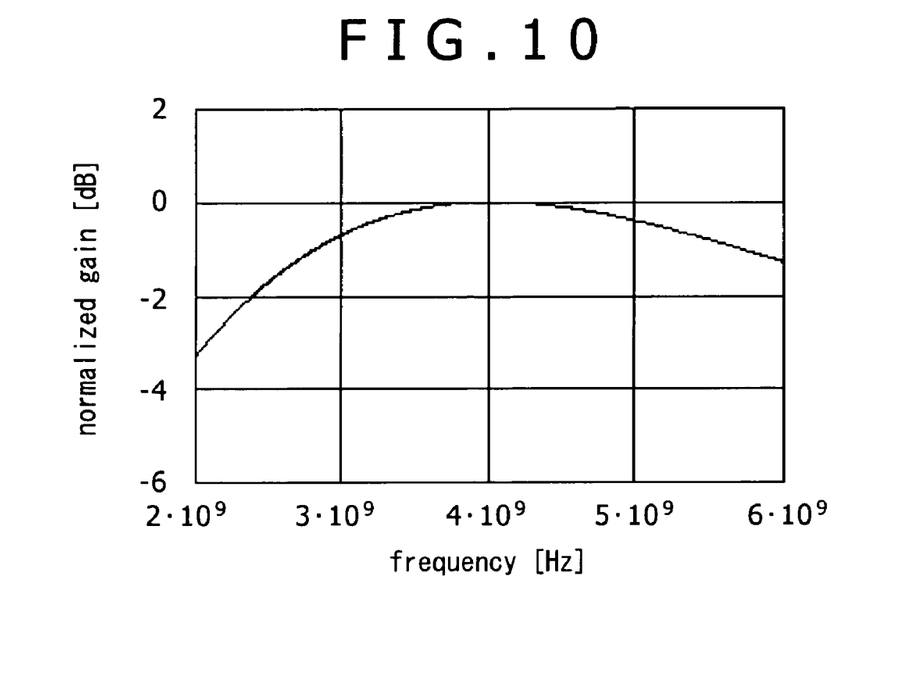
FIG. 10 is a magnitude plot of a frequency response corresponding to the wide-band amplifier of FIG. 8.
Figure 11:
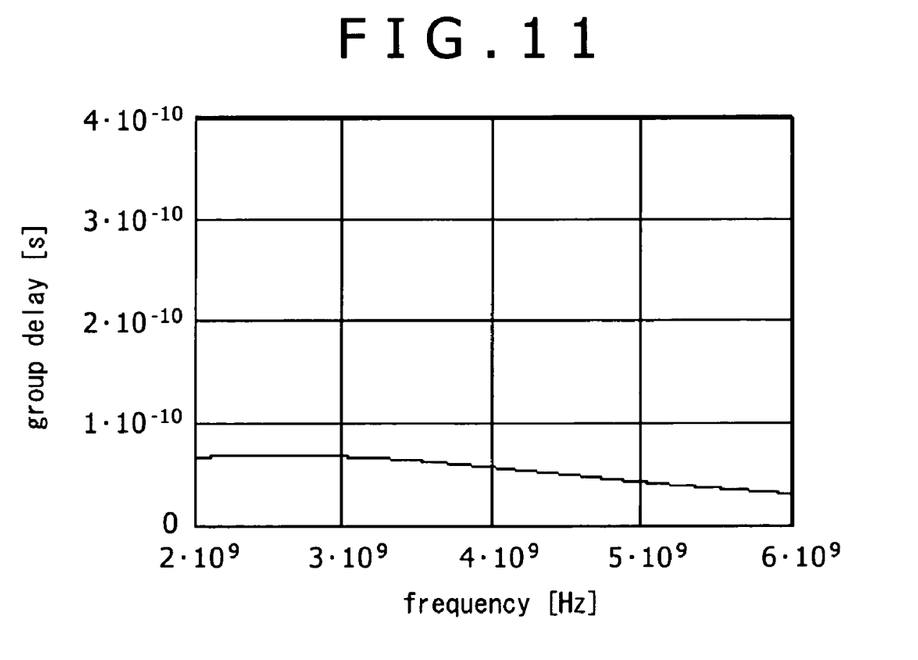
FIG. 11 is a group delay plot of the frequency response corresponding to the wide-band amplifier of FIG. 8.

FIGS. 10 and 11 respectively show a transfer characteristic example and a group delay characteristic of the wide-band amplifier shown in FIG. 8. Each of the characteristics is normalized as gm×RL=1 with a center frequency of 4 GHz. A cross section obtained on the imaginary axis when the band-pass filter has a transfer characteristic of −∞ at the zero and a transfer characteristic of +∞ at each of the poles on the s-plane corresponds to the transfer characteristic of the band-pass filter. The band-pass filter in which the parameter of the LCR parallel resonant circuit (i.e., the s-plane transfer characteristic shown in FIG. 9) is set to flatten the passband (for example, 3 GHz to 5 GHz) is called a Butterworth filter, and such transfer characteristic is called a Butterworth character.

However, as can also be seen from FIGS. 10 and 11, in the wide-band amplifier constructed using the first-order band-pass filter made of the LCR parallel resonant circuit as a load for the amplifier device, the following problems arise.

(1) The frequency characteristic is a single peak characteristic and does not have flatness sufficient to be used in a wide bandwidth. This problem also depends on the fact that the first-order band-pass filter merely has the number of poles that corresponds to the order, i.e., one pole, on one side.

(2) The amplifier has a comparatively simple construction as shown in FIG. 8; nevertheless the wide-band amplifier has group delay time.

In this construction, if the bandwidth over which the flatness is to be maintained is to be widened, the inductance Lp of the coil 103 must be increased, or the resistance value RL of the resistor 105 must be decreased. However, if the inductance Lp is increased, since the self-resonant frequency is low, the amplifier is not suitable for operation at high frequencies. In addition, if the resistance value RL is decreased, the amplifier decreases in gain.

Figure 12:
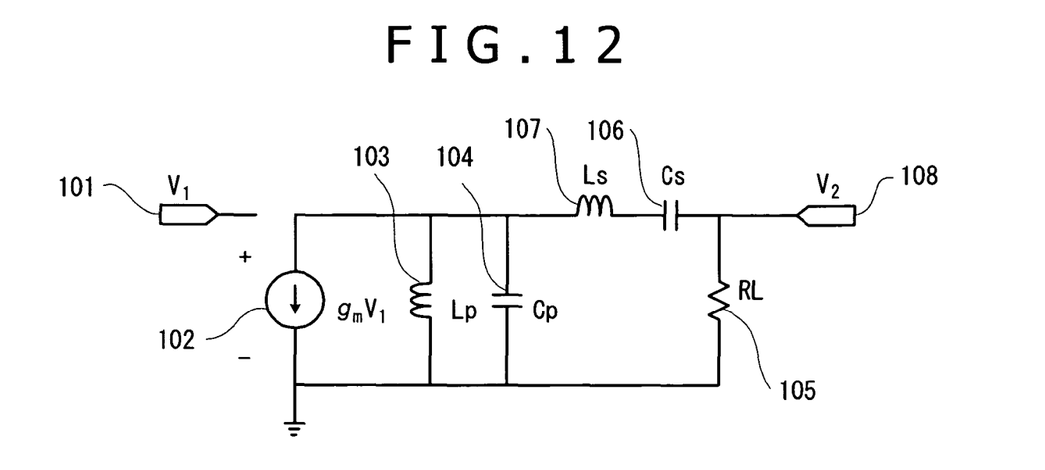
FIG. 12 is a schematic diagram of another conventional wide-band amplifier.

FIG. 12 shows the construction of a wide-band amplifier constructed by a combination of an amplifier device and a second-order band-pass filter (BPF).

As shown, the wide-band amplifier is constructed so that a second-order band-pass filter is provided as a load in parallel with the drain and the source of the amplifier device 102 constructed with MOS-FETs or bipolar transistors. The second-order band-pass filter is constructed with an LC parallel resonant circuit made of the parallel coil Lp 103 and the parallel capacitor Cp 104, an LC series resonant circuit made of a series coil Ls 107 and a series capacitor Cs 106, and the resistor RL 105.

FIG. 12, reference numeral 101 denotes an input terminal of the wide-band amplifier, and reference numeral 108 denotes an output terminal of the wide-band amplifier, and the amplifier device 102 operates as a voltage-controlled current source. Specifically, a voltage V1 at the input terminal 101 is applied to the gate of the amplifier device 102, and the amplifier device outputs a current of gm times the gate voltage V1 in the direction indicated by an arrow in FIG. 12. The voltage provided at the output terminal 108 at this time is denoted by V2.

The transfer function H(s) of the wide-band amplifier shown in FIG. 12 is expressed by the following formula:

$$H(s) = \frac{-s^2 \cdot Lp \cdot Cs \cdot RL \cdot gm}{s^4 \cdot Lp \cdot Ls \cdot Cp \cdot Cs + s^3 \cdot Lp \cdot Cp \cdot Cs \cdot RL + s^2 \cdot (Lp \cdot Cp + Ls \cdot Cs + Lp \cdot Cs) + s \cdot Cs \cdot RL + 1}$$ [Formula 2]

Figure 13:
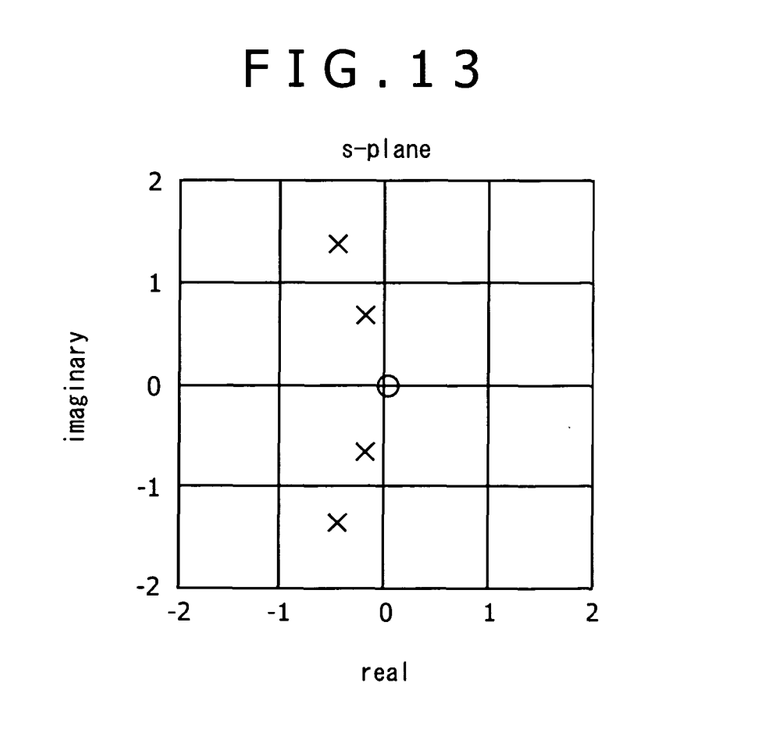
FIG. 13 is an s-plane pole-zero plot corresponding to the other conventional wide-band amplifier of FIG. 12.

FIG. 13 shows a pole-zero map in the s-plane of the wide-band amplifier shown in FIG. 12. In FIG. 13, the symbol "o" denotes a zero, and the symbol "x" denotes a pole. On the s-plane, poles are located at points where the denominator of the transfer function H(s) is 0, while a zero is located at a point where the numerator of the transfer function H(s) is 0. In the shown example, a zero is located at the center of the s-plane, and two poles corresponding to the order of the band-pass filter appear on one side of the s-plane. In this wide-band amplifier, the Butterworth character is adopted in order to flatten the passband (for example, 3 GHz to 5 GHz).

Figure 14:
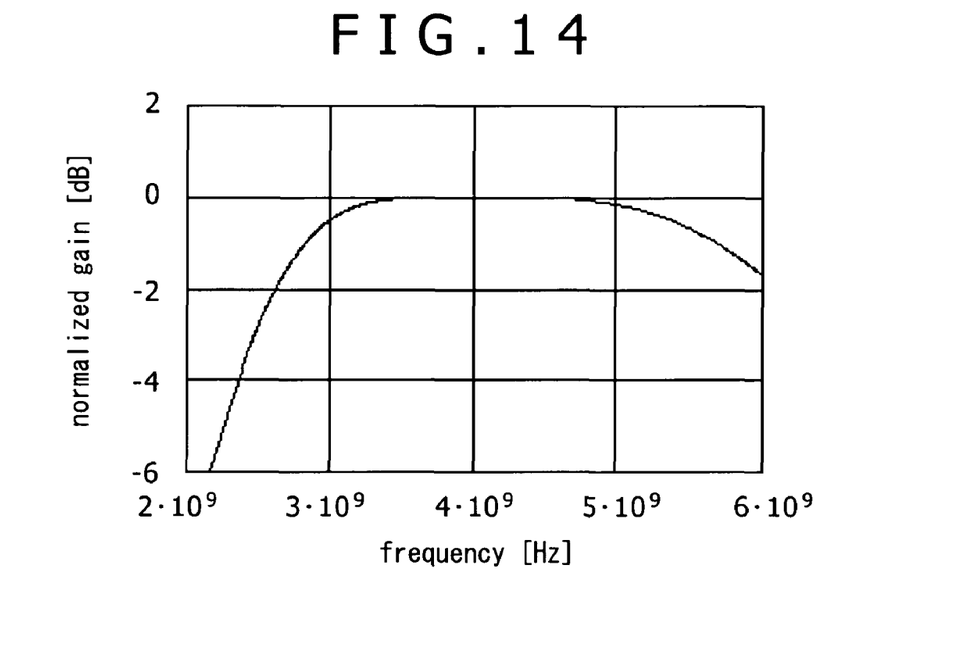
FIG. 14 is a magnitude plot of a frequency response corresponding to the other wide-band amplifier of FIG. 12.
Figure 15:
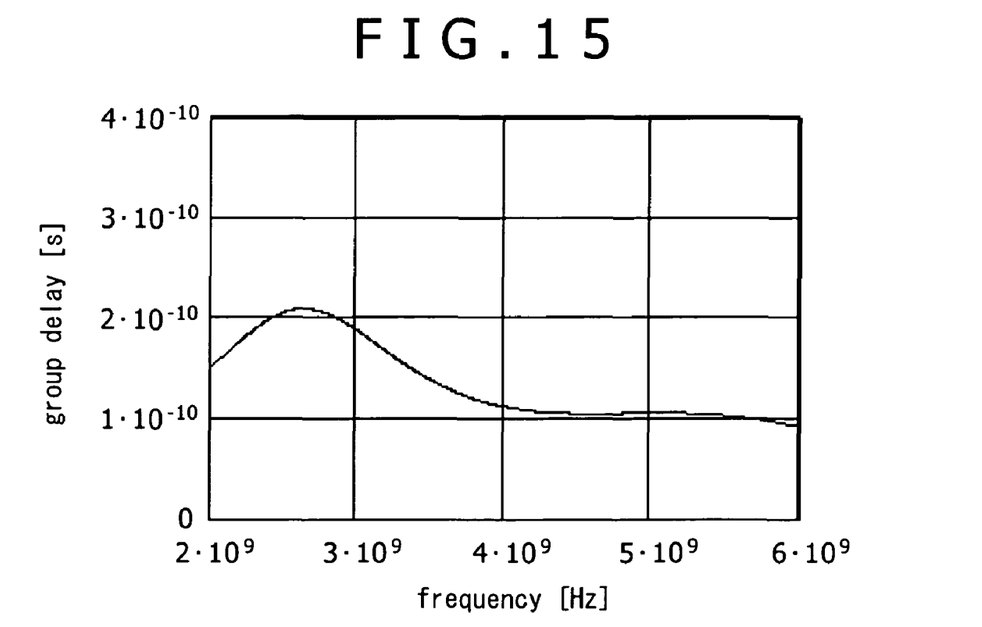
FIG. 15 is a group delay plot of the frequency response corresponding to the other wide-band amplifier of FIG. 12.

FIGS. 14 and 15 respectively show a transfer characteristic example and a group delay characteristic of the wide-band amplifier shown in FIG. 12. Each of the characteristics is normalized as gm×RL=1 with a center frequency of 4 GHz.

In the wide-band amplifier constructed using the second-order band-pass filter as a load for the amplifier device, as can also be seen from a comparison of FIGS. 10 and 14, the characteristic flatness in the passband is improved, but the following problems arise.

(1) The wide-band amplifier shown in FIG. 12 is long in group delay time compared to FIG. 11, and is not suitable for a voltage-feedback amplifier circuit. This problem depends on the fact that the series coil Ls 107 and the series capacitor Cs 106 are inserted in series between the output terminal of the amplifier device 102 and the output terminal 108 of the amplifier and the resonance of this LC circuit becomes a main cause of delay. (In the case of the amplifier shown in FIG. 8, since the output terminal of the amplifier device 102 serves as the output terminal 108 of the amplifier, the problem of group delay does not arise.)

(2) In the case where a subsequent-stage circuit (such as a down-converter, an AGC or an A/D converter) is connected to the output terminal 108 of the amplifier, the circuit acts as parasitic capacitance for the amplifier, but since a capacitance element does not exist between the output terminal of the amplifier and GND, the parasitic capacitance added to the output terminal cannot be absorbed as part of constants and the frequency characteristic degrades.

In the example shown in FIG. 12, since the amplifier is constructed so that the series capacitor Cs 106 and the parasitic capacitance are connected in series, it is difficult to eliminate the influence of parasitic capacitance. On the other hand, in the example shown in FIG. 8, the parallel capacitor Cp and the parasitic capacitance are connected in parallel instead of the construction in which the capacitor is connected in series with the parasitic capacitance, so that it is possible to easily eliminate the problem of parasitic capacitance by decreasing the capacitance of the parallel capacitor Cp 104.

Non-Patent Document 1
Ken Yanagisawa and Noriyoshi Kamiya, "Theory and Design of Filter", (Akiba Shuppan, 1986)

Non-Patent Document 2
Guillermo Gonzales, "Microwave Transistor Amplifiers Analysis and Design", (pp. 170-172, Prentice Hall, 1984)

DISCLOSURE OF THE INVENTION

Problems that the Invention is to Solve

An object of the present invention is to provide a superior amplifier and communication apparatus both of which can be used in UWB communication and can collectively perform amplification in a wide frequency bandwidth.

Another object of the present invention is to provide a superior amplifier and communication apparatus having a flat amplification characteristic over a wide frequency bandwidth, being prevented from degrading due to parasitic capacitance, and being short in group delay time.

Means for Solving the Problems

The present invention has been made in view of the above-mentioned problems, and provides an amplifier characterized by including an amplifier device and a band-pass filter provided as a load for the amplifier device and having an s-plane in which a plurality of poles are provided and zeros are provided between the poles.

A cross section obtained on the imaginary axis when the band-pass filter has a transfer characteristic of $-\infty$ at each of the zeros and a transfer characteristic of $+\infty$ at each of the poles on the s-plane corresponds to the transfer characteristic. From this fact, in accordance with the wide-band amplifier according to the present invention, the characteristic flatness in the passband is improved by the interaction of each of the zeros located at the respective locations other than the origin and the neighboring poles. Specifically, a wide-band characteristic according to the present embodiment is comparable to a characteristic flatness obtainable when a second-order band-pass filter is provided as a load for an amplifier device.

In this construction, the band-pass filter serving as a load for the current output amplifier device is made of an LC parallel resonant circuit and an LCR series resonant circuit provided in parallel with the amplifier device.

The band-pass filter in this case does not have a capacitor provided in series with the output terminal of the amplifier, so that the problem of group delay does not arise, as in the case where a first-order band-pass filter is applied as a load for the amplifier device.

In addition, in this case, the amplifier has a circuit construction in which an inductance and a capacitor are not provided in series between the output terminal of the amplifier device and the output terminal of the amplifier. Accordingly, a capacitance element exists between the output terminal of the amplifier and GND, so that even if a subsequent-stage circuit (such as a down-converter, an AGC or an A/D converter) is connected to the output terminal of the amplifier, it is possible to prevent degradation of the frequency characteristic by absorbing, as part of constants, parasitic capacitance added to the output terminal.

In addition, if the amplifier according to the present invention is combined with a common-gate circuit and a cascode circuit, a wide-band amplifier having input matching widened in bandwidth can be realized.

Otherwise, if the amplifier according to the present invention is combined with a common-source circuit and a cascode circuit, a wide-band amplifier having input matching widened in bandwidth can be realized.

Advantage of the Invention

According to the present invention, since a constant transfer characteristic can be obtained over a wide bandwidth, a wide-band amplifier can be constructed.

In addition, according to the present invention, since group delay time is short, a wide-band amplifier using a voltage feedback amplifier can be constructed.

In addition, according to the present invention, since a parallel capacitor is provided between an output terminal and GND, even if parasitic capacitance is added to the output terminal, the parasitic capacitance can be absorbed as part of constants, so that degradation of the frequency characteristic can be prevented.

In addition, according to the present invention, by combining with a common-gate circuit and a cascode circuit, it is possible to construct a high-gain wide-band amplifier widened in input impedance matching.

In addition, according to the present invention, by combining with a common-source circuit and a cascode circuit and a voltage feedback circuit, it is possible to construct a high-gain wide-band amplifier widened in input impedance matching.

Other objects and advantages of the present invention will become apparent from the following far more detailed description of an embodiment of the present invention, taken in conjunction with the accompanying drawings.

BRIEF DESCRIPTION OF THE DRAWINGS

A more complete appreciation of the inventions and many of the attendant advantages thereof will be readily obtained as the same becomes better understood by reference to the following detailed description when considered in connection with the accompanying drawings. However, the accompanying drawings and their exemplary depictions do not in any way limit the scope of the inventions embraced by this specification. The scope of the inventions embraced by the specification and drawings are defined by the words of the accompanying claims.

BEST MODE FOR CARRYING OUT THE INVENTION

An embodiment of the present invention will be described below in detail with reference to the accompanying drawings.

Figure 1:
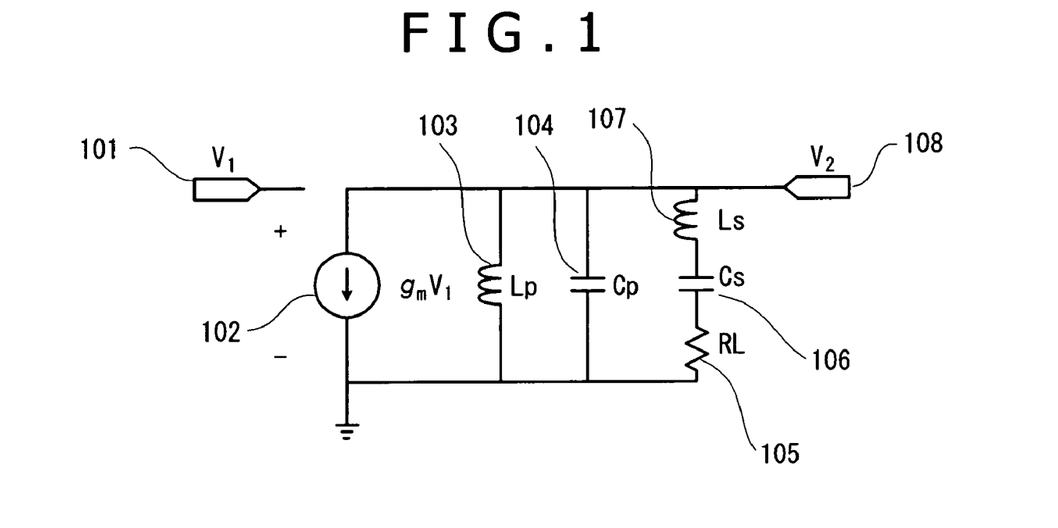
FIG. 1 is a schematic diagram of a wide-band amplifier according to an exemplary embodiment of the present disclosure.

FIG. 1 shows the construction of a wide-band amplifier according to one embodiment of the present invention. This wide-band amplifier is schematically constructed by a combination of an amplifier device made of MOSFETs, bipolar transistors or the like and a band-pass filter.

More specifically, the wide-band amplifier is constructed so that an LC parallel resonant circuit which is made of a parallel coil Lp 103 and a parallel capacitor Cp 104 and an LCR series resonant circuit which is made of a series coil Ls 107, a series capacitor Cs 106 and a resistor RL 105 are provided as a load in parallel with the drain and the source of a current output type of amplifier device 102.

In FIG. 1, reference numeral 101 denotes an input terminal of the wide-band amplifier, and reference numeral 108 denotes an output terminal of the wide-band amplifier, and the amplifier device 102 operates as a voltage-controlled current source. Specifically, a voltage V1 at the input terminal 101 is applied to the gate of the amplifier device 102, and the amplifier device outputs a current of gm times the gate voltage V1 in the direction indicated by an arrow in FIG. 1. The voltage provided at the output terminal 108 at this time is denoted by V2.

The transfer function H(s) of the wide-band amplifier shown in FIG. 1 is expressed by the following formula:

$$H(s) = \frac{-(s^3 \cdot Lp \cdot Ls \cdot Cs + s^2 \cdot Lp \cdot Cs \cdot RL \cdot gm + s \cdot Lp \cdot gm)}{s^4 \cdot Lp \cdot Ls \cdot Cp \cdot Cs + s^3 \cdot Lp \cdot Cp \cdot Cs \cdot RL + s^2 \cdot (Lp \cdot Cp + Ls \cdot Cs + Lp \cdot Cs) + s \cdot Cs \cdot RL + 1}$$ [Formula 3]

Figure 2:
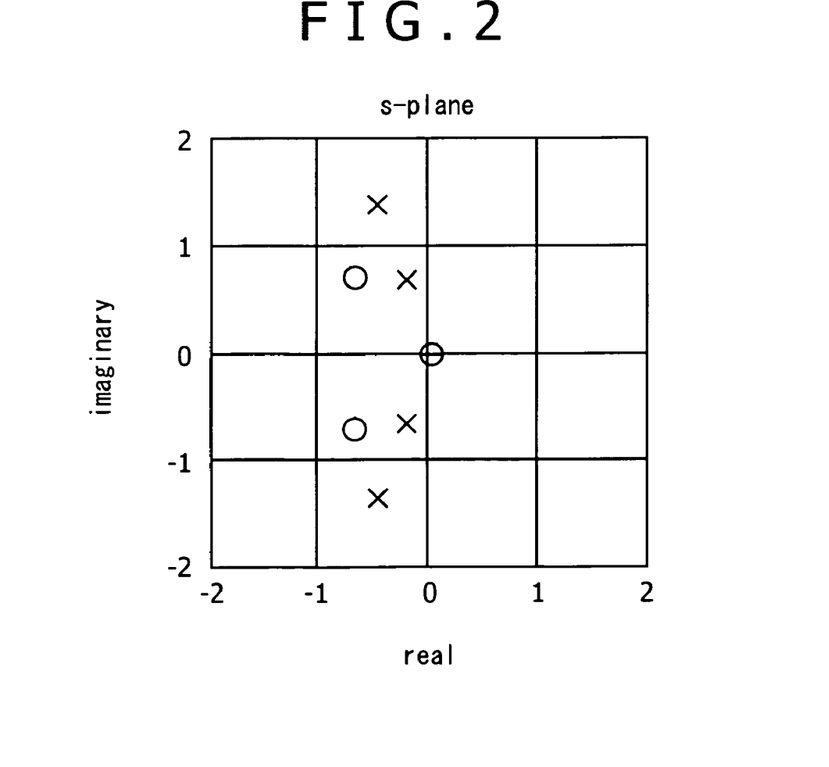
FIG. 2 is an s-plane pole-zero map of the wide-band amplifier of FIG. 1.
Figure 3:
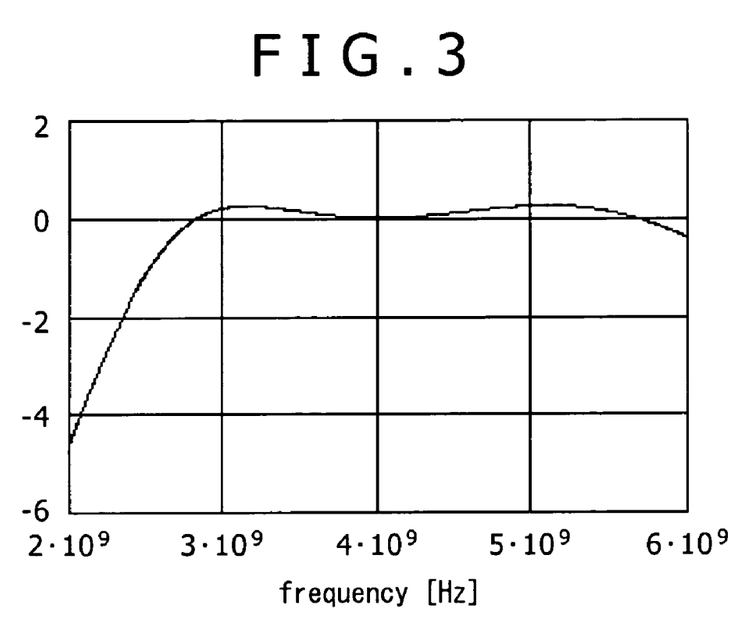
FIG. 3 is a magnitude plot of a frequency response corresponding to the wide-band amplifier of FIG. 1.
Figure 4:
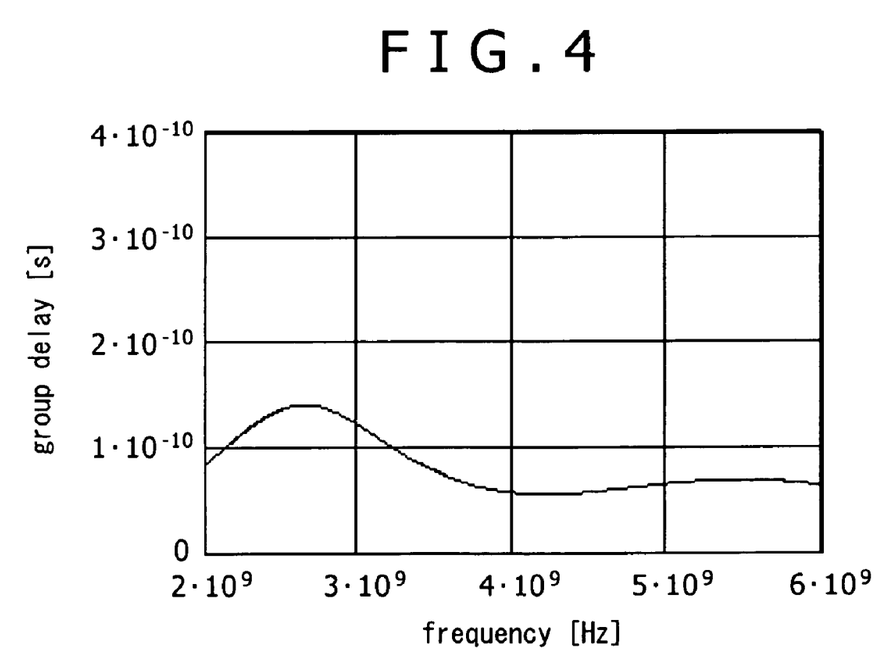
FIG. 4 is a group delay plot of the frequency response corresponding to the wide-band amplifier of FIG. 1.

FIG. 2 shows a pole-zero map in the s-plane of the wide-band amplifier shown in FIG. 1. In FIG. 2, the symbol "o" denotes a zero, and the symbol "x" denotes a pole. In this wide-band amplifier, the Butterworth character is adopted in order to flatten the passband (for example, 3 GHz to 5 GHz). FIGS. 3 and 4 respectively show a transfer characteristic example and a group delay characteristic of the wide-band amplifier shown in FIG. 1. Each of the characteristics is normalized as gm×RL=1 with a center frequency of 4 GHz.

On the s-plane, poles are located at points where the denominator of the transfer function H(s) is 0, while zeroes are located at points where the numerator of the transfer function H(s) is 0. On the s-plane shown in FIG. 2, a zero is located at the center of the s-plane, and two poles corresponding to the order of the band-pass filter appear on one side of the s-plane. Furthermore, in the present embodiment, zeroes are provided between the two poles at locations other than the origin owing to the provision of the LCR series resonant circuit made of the series coil Ls, the series capacitor Cs and the resistor RL.

A cross section obtained on the imaginary axis when the band-pass filter has a transfer characteristic of −∞ at each of the zeros and a transfer characteristic of +∞ at each of the poles on the s-plane corresponds to the transfer characteristic. From this fact, the characteristic flatness in the passband is improved by the interaction of each of the zeros located at the respective locations other than the origin and the neighboring poles. Specifically, a wide-band characteristic according to the present embodiment is comparable to a transfer characteristic (refer to FIG. 14) obtainable when a second-order band-pass filter is provided as a load for an amplifier device (refer to FIG. 12).

In the case of the wide-band amplifier according to the present embodiment, the output terminal of the amplifier device 102 serves as the output terminal 108 of the amplifier, so that the problem of group delay time does not occur, similar to the case where a first-order band-pass filter is applied as a load for an amplifier device (refer to FIG. 8). This fact can also be understood from a comparison between FIGS. 4 and 11.

In the case of the wide-band amplifier according to the present embodiment, as can be seen from FIG. 1, both of the parallel capacitor 104 and the series capacitor 106 are provided in parallel with the output terminal. Specifically, a capacitance element exists between the output terminal of the amplifier and GND, so that even if a subsequent-stage circuit (such as a down-converter, an AGC or an A/D converter) is connected to the output terminal 108 of the amplifier, it is possible to prevent degradation of the frequency characteristic by absorbing, as part of constants, parasitic capacitance added to the output terminal.

Figure 5:
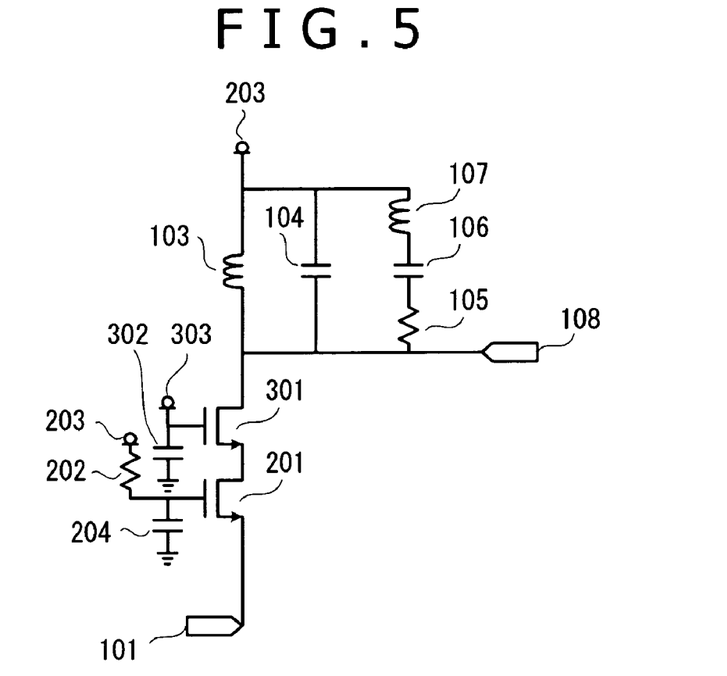
FIG. 5 is a schematic diagram of a common-gate cascade wide-band amplifier according to another exemplary embodiment of the present disclosure.

FIG. 5 shows a construction example in which a common-gate cascode amplifier is applied as a current output amplifier device in the wide-band amplifier shown in FIG. 1.

The input terminal 101 is connected to the source of a MOS-FET 201 so that an input signal is applied thereto. A capacitor 204 is connected between the gate of the MOS-FET 201 and GND so that the gate of the MOS-FET 201 is connected to AC ground. A resistor 202 is connected between the gate of the MOS-FET 201 and a bias terminal 203 so that a predetermined gate voltage is supplied to the MOS-FET 201. The source of a MOS-FET 301 is connected to the drain of the MOS-FET 201 so as to construct a cascode circuit.

A capacitor 302 is connected between the gate of the MOS-FET 301 and GND so that the gate of the MOS-FET 301 is connected to AC ground. The gate of the MOS-FET 301 is connected to a bias terminal 303 so that a predetermined gate voltage is applied to the gate.

Reference numerals 103 and 104 respectively denote a parallel inductor Lp and a parallel capacitor Cp which constitute an LC parallel resonant circuit. Reference numerals 107, 106 and 105 respectively denote a series inductor Ls, a series capacitor Cs and a resistor RL which constitute an LCR series resonant circuit. These LC parallel resonant circuit and LCR series resonant circuit are provided in parallel as a load for the amplifier device. Reference numeral 108 denotes an output terminal.

Since the MOS-FET 201 is gate-grounded (the source serves as an input), the input impedance is originally low and the bandwidth of impedance matching can be widened, so that good antenna matching can be obtained. In addition, since the gate width W of the cascode-connected MOS-FET 301 can be set independently of the gate width W of the MOS-FET 201, the shown construction example is suitable for increasing the gate width W of the MOS-FET 201 to obtain high gain. Furthermore, the output circuit of the present invention makes it possible to obtain constant voltage gain over a wide bandwidth.

Figure 6:
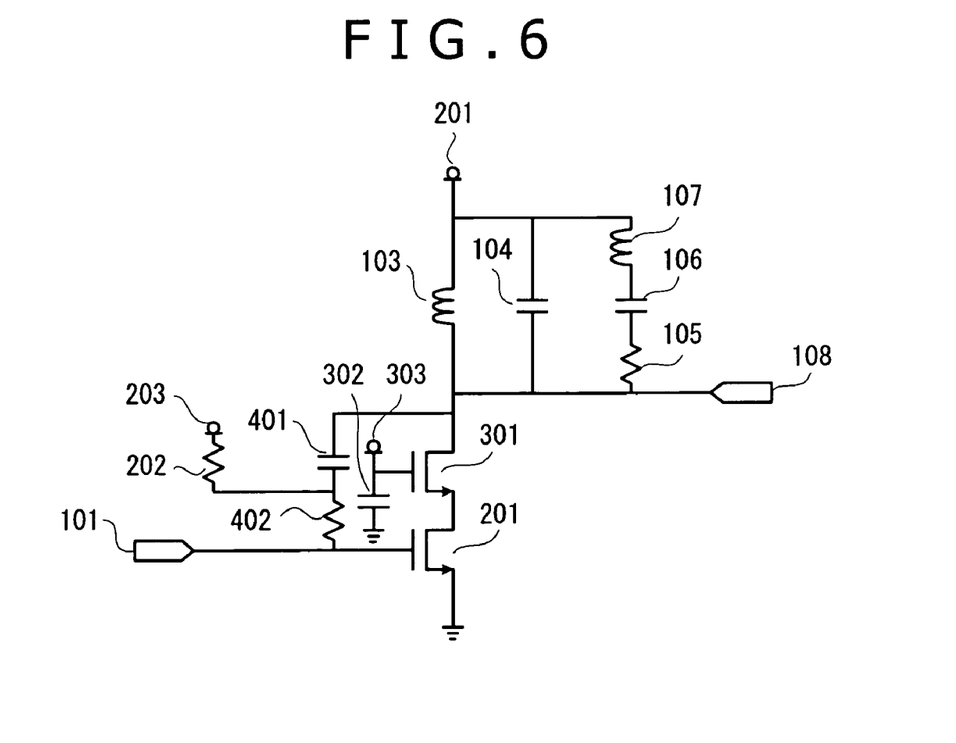
FIG. 6 is a schematic diagram of a common-source cascade wide-band amplifier according to another exemplary embodiment of the present disclosure.

FIG. 6 shows a construction example in which a common-source cascode amplifier with voltage feedback is applied as a current output amplifier device in the wide-band amplifier shown in FIG. 1.

The input terminal 101 is connected to the gate of the MOS-FET 201 so that an input signal is applied thereto. The source of the MOS-FET 201 is connected to GND. The source of the MOS-FET 301 is connected to the drain of the MOS-FET 201 so as to construct a cascode circuit.

The capacitor 302 is connected between the gate of the MOS-FET 301 and GND so that the gate of the MOS-FET 301 is connected to AC ground. The gate of the MOS-FET 301 is connected to the bias terminal 303 so that a predetermined gate voltage is applied to the gate.

A capacitor 401 is connected between the drain of the MOS-FET 301 and a resistor 402 so as to cut off direct current along the path of voltage feedback. The resistor 402 is connected between the capacitor 401 and the gate of the MOS-FET 201 so as to construct a feedback path for voltage feedback. The resistor 202 is connected between the resistor 402 and the bias terminal 203 so that a predetermined gate voltage is supplied to the MOS-FET 201.

Reference numerals 103 and 104 respectively denote a parallel inductor Lp and a parallel capacitor Cp which constitute an LC parallel resonant circuit. Reference numerals 107, 106 and 105 respectively denote a series inductor Ls, a series capacitor Cs and a resistor RL which constitute an LCR series resonant circuit. These LC parallel resonant circuit and LCR series resonant circuit are provided in parallel as a load for the amplifier device. Reference numeral 108 denotes an output terminal.

In this case, since the gate is an input, impedance becomes high, but owing to the voltage feedback formed by the connection between the capacitor 401 and the resistor 402, the input impedance can be lowered to widen the bandwidth of impedance matching, thereby realizing antenna matching. In addition, since the MOS-FET 301 is cascode-connected, the shown construction is suitable for decreasing the mirror capacitance between the drain and the gate of the MOS-FET 201 to increase the gain thereof. Furthermore, the output circuit of the present invention makes it possible to obtain constant voltage gain over a wide bandwidth.

Figure 7:
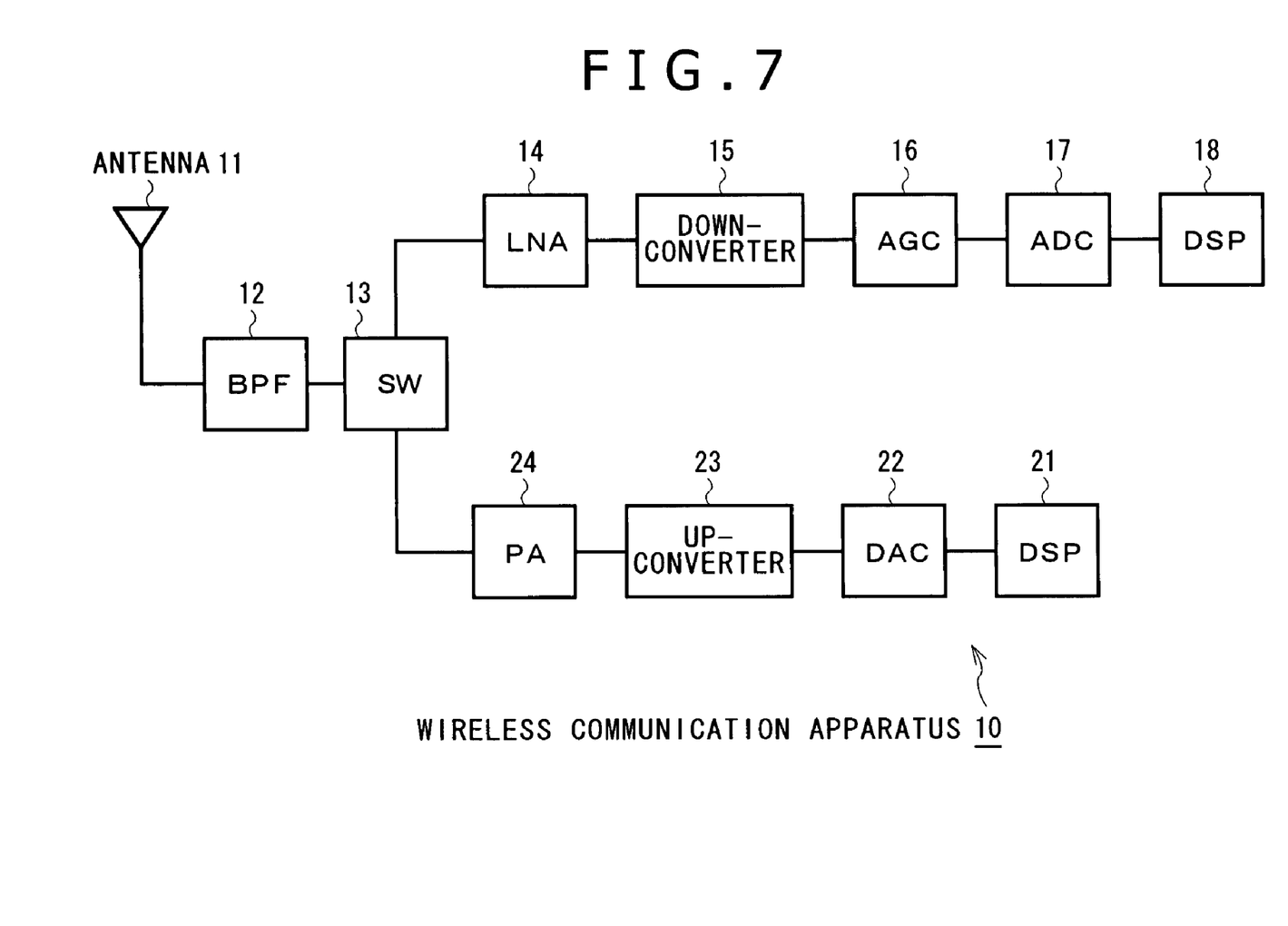
FIG. 7 is a block diagram of a wireless communication apparatus according to an exemplary embodiment of the present disclosure.

Finally, the construction of a wireless communication apparatus in which the wide-band amplifier according to the present embodiment is applied to an LNA will be described with reference to FIG. 7.

A wireless communication apparatus 10 performs UWB communication which carries out wireless communication by using, for example, an extremely wide frequency bandwidth. The shown wireless communication apparatus 10 is provided with a transmitting/receiving antenna 11 and a band-pass filter 12, and is branched into a reception line and a transmission line via a transmission/reception switch 13.

The reception line is constructed with a low noise amplifier (LNA) 14 which amplifies the voltage of a received signal, a down-converter 15 which down-converts the voltage-amplified received signal by frequency conversion, an automatic gain controller (AGC) 16, an analog-digital converter 17, and a signal processing circuit 18 which performs digital signal processing of received data.

In this construction, if the wide-band amplifier shown in FIG. 1 is used as the low noise amplifier 14, voltage amplification can be collectively effected in a wide frequency bandwidth. In this case, since group delay time is short, it is possible to construct a wide-band amplifier using an amplifier with voltage feedback. In addition, even if a circuit at a stage subsequent to the down-converter 15 acts as parasitic capacitance, since the parallel capacitor is provided between the output terminal and GND, the parasitic capacitance added to the output terminal can be absorbed as part of constants, so that degradation of the frequency characteristic can be prevented (as mentioned previously).

On the other hand, the transmission line is constructed with a digital signal processing circuit 21 which perform signal processing of transmit data, a digital-analog converter 22 which converts the transmit data into an analog signal, an up-converter 23 which up-converts the analog transmit signal by frequency conversion, and a power amplifier (PA) 24 which amplifies the power of the up-converted transmit signal.

INDUSTRIAL APPLICABILITY

The present invention has been described above in detail with reference to a specific embodiment. It is obvious, however, that those skilled in the art can make modifications and alternations to the above-mentioned embodiment without departing from the scope of the present invention.

The above description of the construction and advantages of the present invention focuses on the case where the wide-band amplifier is mainly applied to voltage amplification during reception by a wireless communication apparatus, but the scope of the present invention is not limited to the above-mentioned case. It goes without saying that the present invention can be likewise realized even if the wide-band amplifier according to the present invention is applied to transmission in wireless communication or to voltage amplification in uses other than wireless communication.

In other words, the foregoing description of the present invention has been given for illustrative purposes only, and the contents described herein are not to be construed in a limitative way. The scope of the present invention is to be understood as defined by the scope of the appended claims.

The invention claimed is:

1. A wide-band amplifier comprising:
an input terminal configured to receive an input voltage;
an output terminal configured to provide an amplified output voltage;
an amplification device connected between the input terminal and the output terminal, an output of the amplification device being directly connected to the output terminal;
an LC parallel resonant circuit connected between the output terminal and a ground terminal in parallel to the amplification device; and
an LCR series resonant circuit connected between the output terminal and the ground terminal in parallel to the amplification device and the LC parallel resonant circuit,
wherein the amplification device includes a first MOS-FET transistor having a drain connected to a source of a second MOS-FET transistor, a drain of the second MOS-FET transistor being connected to the output terminal, a source of the first MOS-FET transistor being connected to the input terminal, a gate of the first MOS-FET transistor being connected to a first bias terminal via a bias resistor and to the ground terminal via a first bias capacitor, the gate of the second MOS-FET transistor being connected to a second bias terminal and to the ground terminal via a second bias capacitor.

2. An amplifier according to claim 1, wherein the amplification device includes a combination of a common-gate circuit and a cascade circuit.

3. An amplifier according to claim 1, wherein the amplification device includes a combination of a common-source circuit, a cascade circuit, and a voltage feedback circuit.

4. A wireless communication apparatus comprising:
an antenna;
a band-pass filter;
a low noise amplifier configured to amplify a voltage of a received signal, the low noise amplifier including
an input terminal configured to receive the received signal;
an output terminal configured to provide an amplified signal;
an amplification device connected between the input terminal and the output terminal, an output of the amplification device being directly connected to the output terminal of the low noise amplifier,
an LC parallel resonant circuit connected between the output terminal and a ground terminal in parallel to the amplification device, and
an LCR series resonant circuit connected between the output terminal and the ground terminal in parallel to the amplification device and the LC parallel resonant circuit;
a down-converter connected to the output terminal of the low noise amplifier and configured to down-convert the amplified signal provided by the output terminal by frequency conversion;
an automatic gain controller;
an analog-digital converter; and a signal processing circuit configured to perform digital signal processing of received data wherein the amplification device includes a first MOS-FET transistor having a drain connected to a source of a second MOS-FET transistor, a drain of the second MOS-FET transistor being connected to the output terminal, a source of the first MOS-FET transistor being connected to the input terminal, a gate of the first MOS-FET transistor being connected to a first bias terminal via a bias resistor and to the ground terminal via a first bias capacitor, the gate of the second MOS-FET transistor being connected to a second bias terminal and to the ground terminal via a second bias capacitor.

5. A wireless communication apparatus comprising:
an antenna;
a band-pass filter;
a low noise amplifier configured to amplify a voltage of a received signal, the low noise amplified including
an input terminal configured to receive the received signal;
an output terminal configured to provide an amplified signal;
an amplification device connected between the input terminal and the output terminal,
an LC parallel resonant circuit connected between the output terminal and a ground terminal in parallel to the amplification device, and
an LCR series resonant circuit connected between the output terminal and the ground terminal in parallel to the amplification device and the LC parallel resonant circuit;
a down-converter connected to the output terminal of the low noise amplifier and configured to down-convert the amplified signal provided by the output terminal by frequency conversion;
an automatic gain controller;
an analog-digital converter;
a digital-analog converter configured to convert transmit data to an analog signal, the down-converter being directly coupled to the amplification device;
an up-converter configured to up-convert the analog transmit signal by frequency conversion;
a power amplifier configured to amplify a power of the up-converted transmit signal; and
a signal processing circuit configured to perform digital signal processing of transmit/receive data,
wherein the amplification device includes a first MOS-FET transistor having a drain connected to a source of a second MOS-FET transistor, a drain of the second MOS-FET transistor being connected to the output terminal, a source of the first MOS-FET transistor being connected to the input terminal, a gate of the first MOS-FET transistor being connected to a first bias terminal via a bias resistor and to the ground terminal via a first bias capacitor, the gate of the second MOS-FET transistor being connected to a second bias terminal and to the ground terminal via a second bias capacitor.

6. A wide-band amplifier comprising:
an input terminal configured to receive an input voltage;
an output terminal configured to provide an output voltage;
an amplification device connected between the input terminal and the output terminal, and output of the amplification device being directly connected to the output terminal; and
an analog band-pass filter connected between the output terminal and a ground terminal in parallel to the amplification device, the analog band-pass filter having a plurality of poles provided on a left side of an s-plane and a plurality of zeros arranged between the poles, at least two zeros being arranged at locations other than an origin of the s-plane, wherein the amplification device includes a first MOS-FET transistor having a drain connected to a source of a second MOS-FET transistor, a drain of the second MOS-FET transistor being connected to the output terminal, a source of the first MOS-FET transistor being connected to the input terminal, a gate of the first MOS-FET transistor being connected to a first bias terminal via a bias resistor and to the ground terminal via a first bias capacitor, the gate of the second MOS-FET transistor being connected to a second bias terminal and to the ground terminal via a second bias capacitor.

7. An amplifier according to claim 6, wherein the band-pass filter does not have a capacitor provided in series with an output terminal of the amplifier.

8. An amplifier according to claim 6, wherein an inductance and a capacitor are not provided in series between an output terminal of the amplification device and an output terminal of the amplifier.

9. An amplifier according to claim 6, wherein the amplification device includes a combination of a common-gate circuit and a cascade circuit.

10. An amplifier according to claim 6, wherein the amplification device includes a combination of a common-source circuit, a cascade circuit, and a voltage feedback circuit.

11. A wireless communication apparatus comprising:
an antenna;
a band-pass filter;
a low noise amplifier configured to amplify a voltage of a received signal, the low noise amplifier including
an input terminal to receive the received signal;
an output terminal to provide an amplified signal;
an amplification device connected between the input terminal and the output terminal, an output of the amplification device being directly connected to the output terminal, and
an analog band-pass filter connected between the output terminal and a ground terminal in parallel to the output terminal of the amplification device, the analog band-pass filter having a plurality of poles provided on a left side of an s-plane and a plurality of zeros arranged between the poles, at least two zeros being arranged at locations other than an origin of the s-plane;
a down-converter connected to the output terminal and configured to down-convert the amplified signal provided by the output terminal by frequency conversion;
an automatic gain controller;
an analog-digital converter; and
a signal processing circuit configured to perform digital signal processing of received data,
wherein the amplification device includes a first MOS-FET transistor having a drain connected to a source of a second MOS-FET transistor, a drain of the second MOS-FET transistor being connected to the output terminal, a source of the first MOS-FET transistor being connected to the input terminal, a gate of the first MOS-FET transistor being connected to a first bias terminal via a bias resistor and to the ground terminal via a first bias capacitor, the gate of the second MOS-FET transistor being connected to a second bias terminal and to the ground terminal via a second bias capacitor.

12. A wireless communication apparatus comprising:
an antenna;
a band-pass filter;
a low noise amplifier configured to amplify a voltage of a received signal, the low noise amplifier including an input terminal configured to receive the received signal;

an output terminal configured to provide an amplified signal;

an amplification device connected between the input terminal and the output terminal, an output of the amplification device being directly connected to the output terminal, and an analog band-pass filter connected between the output terminal and a ground terminal in parallel to the output terminal of the amplification device, the analog band-pass filter having a plurality of poles provided on a left side of an s-plane and a plurality of zeros arranged between the poles, at least two zeros being arranged at locations other than an origin of the s-plane;

a down-converter connected to the output terminal and configured to down-convert the amplified signal by frequency conversion;

an automatic gain controller;

an analog-digital converter;

a digital-analog converter configured to convert transmit data to an analog signal;

an up-converter configured to up-convert the analog transmit signal by frequency conversion;

a power amplifier configured to amplify a power of the up-converted transmit signal; and a signal processing circuit configured to perform digital signal processing of transmit/receive data, wherein the amplification device includes a first MOS-FET transistor having a drain connected to a source of a second MOS-FET transistor, a drain of the second MOS-FET transistor being connected to the output terminal, a source of the first MOS-FET transistor being connected to the input terminal, a gate of the first MOS-FET transistor being connected to a first bias terminal via a bias resistor and to the ground terminal via a first bias capacitor, the gate of the second MOS-FET transistor being connected to a second bias terminal and to the ground terminal via a second bias capacitor.

* * * * *